United States Patent
Goel et al.

(10) Patent No.: US 8,785,907 B2
(45) Date of Patent: Jul. 22, 2014

(54) EPITAXIAL FILM GROWTH ON PATTERNED SUBSTRATE

(71) Applicants: Niti Goel, Austin, TX (US); Niloy Mukherjee, Beaverton, OR (US); Seung Hoon Sung, Beaverton, OR (US); Van H. Le, Beaverton, OR (US); Matthew V. Metz, Portland, OR (US); Jack T. Kavalieros, Portland, OR (US); Ravi Pillarisetty, Portland, OR (US); Sanaz K. Gardner, Portland, OR (US); Sansaptak Dasgupta, Hillsboro, OR (US); Willy Rachmady, Beaverton, OR (US); Benjamin Chu-Kung, Hillsboro, OR (US); Marko Radosavljevic, Beaverton, OR (US); Gilbert Dewey, Hillsboro, OR (US); Marc C. French, Hillsboro, OR (US); Jessica Kachian, Portland, OR (US); Satyarth Suri, Hillsboro, OR (US); Robert S. Chau, Portland, OR (US)

(72) Inventors: Niti Goel, Austin, TX (US); Niloy Mukherjee, Beaverton, OR (US); Seung Hoon Sung, Beaverton, OR (US); Van H. Le, Beaverton, OR (US); Matthew V. Metz, Portland, OR (US); Jack T. Kavalieros, Portland, OR (US); Ravi Pillarisetty, Portland, OR (US); Sanaz K. Gardner, Portland, OR (US); Sansaptak Dasgupta, Hillsboro, OR (US); Willy Rachmady, Beaverton, OR (US); Benjamin Chu-Kung, Hillsboro, OR (US); Marko Radosavljevic, Beaverton, OR (US); Gilbert Dewey, Hillsboro, OR (US); Marc C. French, Hillsboro, OR (US); Jessica Kachian, Portland, OR (US); Satyarth Suri, Hillsboro, OR (US); Robert S. Chau, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/722,746

(22) Filed: Dec. 20, 2012

(65) Prior Publication Data

US 2014/0175378 A1 Jun. 26, 2014

(51) Int. Cl.
*H01L 29/06* (2006.01)

(52) U.S. Cl.
USPC 257/15; 257/190; 257/E29.072; 257/E21.125

(58) Field of Classification Search
USPC .................... 257/15, 190, E29.072, E21.125
See application file for complete search history.

(56) References Cited

U.S. PATENT DOCUMENTS

| 7,494,911 B2 | 2/2009 | Hudait | |
|---|---|---|---|
| 2013/0105818 A1* | 5/2013 | Cheng et al. | 257/77 |

OTHER PUBLICATIONS

Bohr, Mark, "Intel's Revolutionary 22 nm Transistor Technology", May 2011, 1-28.
Lochtefeld, Anthony, "Defect Reduction for Lattice Mismatched Epitaxy Via Aspect Ratio Trapping", Solid State Technology, Aug. 1, 2008, 5 pages.
Raychaudhuri, S., "Calculation of Critical Dimensions for Wurtzite and Cubic Zinc Blende Coaxial Nanowire Heterostructures", Jul./Aug. 2006, 2053-5059, B 24(4), AVS: Science & Technology of Materials, Interfaces, and Processing.

(Continued)

*Primary Examiner* — Tu-Tu Ho
(74) *Attorney, Agent, or Firm* — Trop, Pruner & Hu, P.C.

(57) ABSTRACT

An embodiment includes depositing a material onto a substrate where the material includes a different lattice constant than the substrate (e.g., III-V or IV epitaxial (EPI) material on a Si substrate). An embodiment includes an EPI layer formed within a trench having walls that narrow as the trench extends upwards. An embodiment includes an EPI layer formed within a trench using multiple growth temperatures. A defect barrier, formed in the EPI layer when the temperature changes, contains defects within the trench and below the defect barrier. The EPI layer above the defect barrier and within the trench is relatively defect free. An embodiment includes an EPI layer annealed within a trench to induce defect annihilation. An embodiment includes an EPI superlattice formed within a trench and covered with a relatively defect free EPI layer (that is still included in the trench). Other embodiments are described herein.

24 Claims, 8 Drawing Sheets

(56) References Cited

OTHER PUBLICATIONS

Kavanagh, Karen L., "Misfit Dislocations in Nanowire Heterostructures" Jan. 22, 2010, 1-7, Semicond. Sci. Technol. 25, IOP Publishing.

Xue, Zhongying, "Epitaxial Growth of Fully Relaxed Si0.75Ge0.25 on SOI Substrate" 2011, 5021-5024, Applied Surface Science 257.

Rehder, E. M., "SiGe Relaxation on Silicon-On-Insulator Substrates: An Experimental and Modeling Study", Dec. 15, 2003, 7892-7903, Journal of Applied Physics, vol. 94, No. 12.

Esfandyarpour, Rahim, "Tunneling Field Effect Transistors", Jun. 12, 2012, 6 pages.

* cited by examiner

EPITAXIAL FILM GROWTH ON PATTERNED SUBSTRATE

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of Si since use of a Si substrate has the additional advantage of cost reduction.

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer by relaxing the EPI film. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

In the following description, numerous specific details are set forth but embodiments of the invention may be practiced without these specific details. Well known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

An embodiment includes depositing a material onto a substrate where the material includes a different lattice constant than the substrate (e.g., III-V or IV EPI material on a Si substrate). An embodiment includes an EPI layer formed within a trench having walls that narrow as the trench extends upwards. An embodiment includes an EPI layer formed within a trench using multiple growth temperatures. A defect barrier, formed in the EPI layer when the temperature changes, contains defects within the trench and below the defect barrier. The EPI layer above the defect barrier and within the trench is relatively defect free. An embodiment includes an EPI layer annealed within a trench to induce defect annihilation. An embodiment includes an EPI superlattice formed within a trench and covered with a relatively defect free EPI layer (that is still included in the trench). Other embodiments are described herein.

A conventional technique for EPI formation includes Aspect Ratio Trapping (ART). ART is based on threading dislocations that propagate upwards at a specific angle. In ART a trench is made with a high enough aspect ratio such that the defects terminate on the sidewall of the trench and any layer above the terminations is defect free. More specifically, ART includes trapping defects along the sidewall of a shallow trench isolation (STI) portion by making the height (H) of the trench larger than the width (W) of the trench such that H/W ratio is at least 1.50. This ratio gives the minimum limit for ART to block defects within a buffer layer.

Figure 1A:
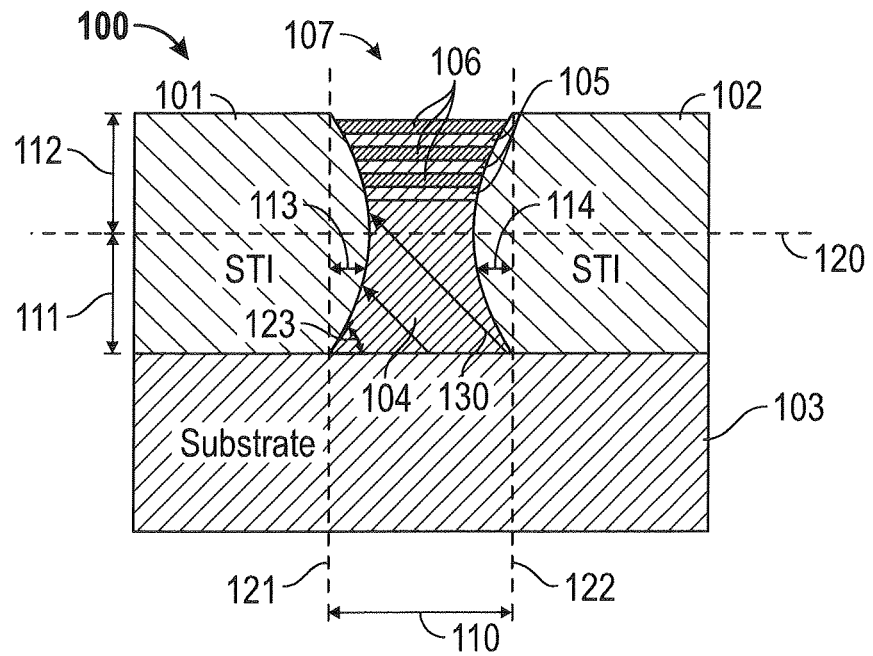
FIGS. 1(a)-(b) depict a trench with narrowing sidewalls in an embodiment.
Figure 1B:
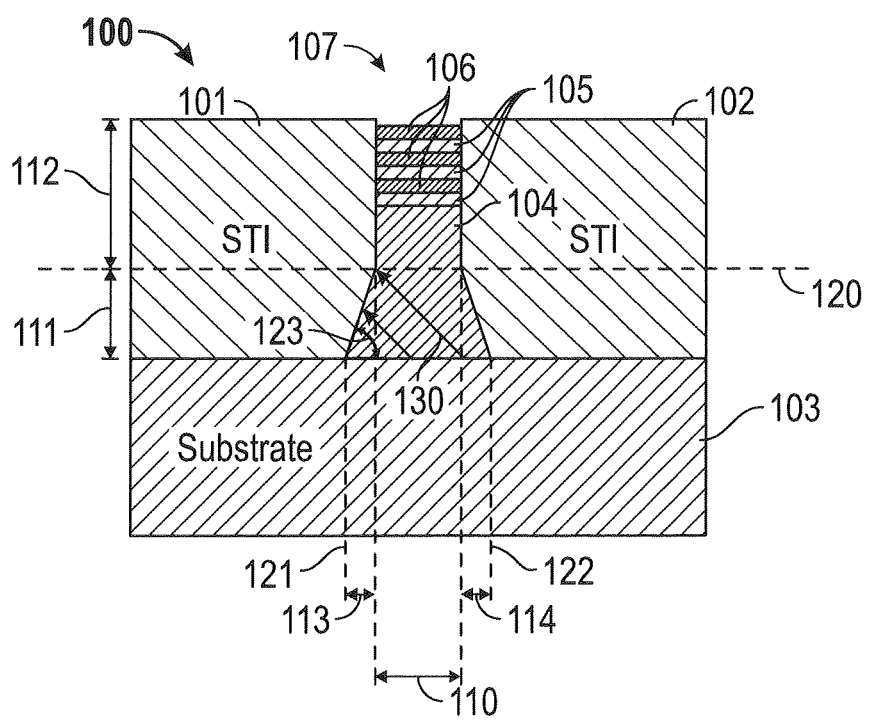
Figure 5:
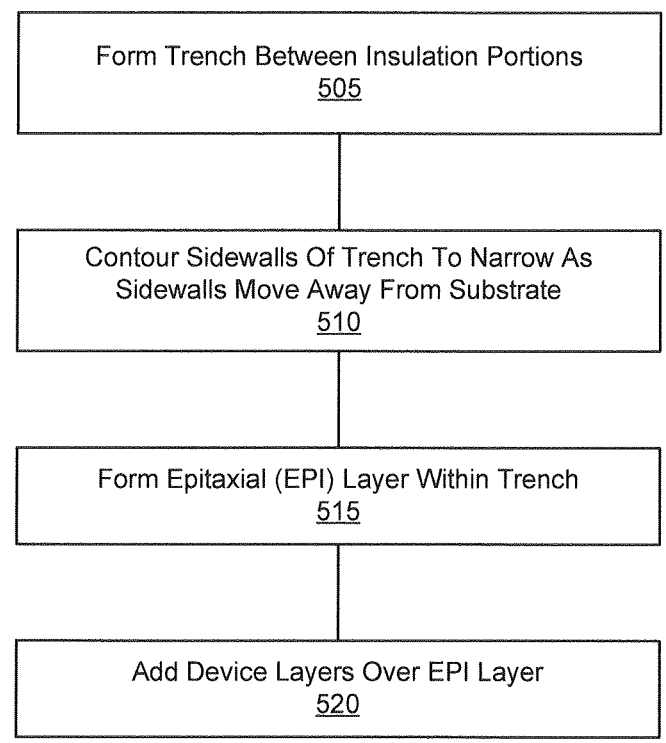
FIG. 5 includes a process in an embodiment.

FIGS. 1(a)-(b) depict a trench with narrowing sidewalls in an embodiment of the invention. FIG. 5 includes a process in an embodiment of the invention. FIGS. 1(a) and 5 are first discussed and then FIG. 1(b) is discussed.

In an embodiment trench 107, having a top and a bottom, is included in between insulation portions 101, 102 (Block 505) of device 100. The sidewalls of trench 107 may be shaped to narrow as they move away from substrate 103 (Block 510, described further below). Such insulation portions may include STI portions but other embodiments are not so limited. Portions 101, 102 are included on substrate 103, which has a first lattice constant. Substrate 103 may contain Si, such as a Si and/or SiGe substrate. One embodiment includes a SiGe common buffer on a Si substrate, but other embodiments are not so limited. Trench 107 extends downwards towards substrate 103. Trench 107 has a lower width 110 adjacent the trench bottom and an upper width above the lower width, and the upper width is narrower than the lower width. The upper width may be along horizontal axis 120, which is located at the narrowest portion of trench 107. The upper width is determined from the differential between width 110 and deviations 113, 114. Deviation 113 is the distance between trench 107 sidewall and axis 121 and deviation 114 is the distance between trench 107 sidewall and axis 122.

Lower EPI layer 104 has a second lattice constant mismatched with the first lattice constant that corresponds to substrate 103 (or a top layer of substrate 103 if an intermediate layer, such as a buffer layer, is included between the lower portions of substrate 103 and EPI layer 104). EPI layer 104 is formed in trench 107, adjacent the trench bottom, and below the trench upper width located at the narrowest portion of trench 107 (Block 515).

An upper EPI layer is included in trench 107 above lower EPI layer 104. For example, any of EPI layers 106 may constitute such an upper EPI layer. Further, any of EPI layers 105 may constitute such an upper EPI layer. Any of EPI layers 105, 106 may be included in a device layer that may form, in part, a device such as a channel of a transistor (Block 520). Any of EPI layers 105, 106 may have a lattice constant different from the lattice constants of substrate 103 and/or EPI layer 104. For example, EPI layer 105 may have lattice constant such that a differential between the substrate lattice constant and the lattice constant for EPI layer 105 is greater than a differential between the substrate lattice constant and the lattice constant for EPI layer 104. In one embodiment, substrate 103 includes Si (e.g., Si and/or SiGe), EPI layer 104 includes a III-V or IV material, EPI layer 105 includes a III-V or IV material, and EPI layer 106 includes a III-V or IV material. III-V and IV materials include, without limitation, Ge, SiGe, GaAs, AlGaAs, InGaAs, InAs, and InSb. Each or any of components 103, 104, 105, 106 may be different materials, such as materials including different compositions such as $Si_xGe_{1-x}$ and $Si_yGe_{1-y}$ where x is unequal to y. In other embodiments, the materials may be completely different such as InP, SiGe, and/or GaAs.

In an embodiment lower EPI layer 104 includes more defects than upper EPI layers 105 and/or 106. In an embodiment lower EPI layer 104 includes more defects than the portion of EPI layers 104 above axis 120. For example, defect 130 terminates within EPI layer 104. In one embodiment well trench 107 includes a length (not shown in FIG. 1(a)) less than the trench overall height, which is composed of height 111 (which extends from the trench bottom to the narrowest portion of the trench) and height 112 (which extends from the narrowest portion of the trench to the top of the trench). In one embodiment the combination of heights 111, 112 is greater than 100 nm and width 110 is less than the combination of heights 111, 112.

In one embodiment EPI layer 104 may include n-MOS material (e.g., InP, SiGe, GaAs) grown as a buffer layer in trench 107 using various methods (e.g., molecular beam epitaxy, metal-organic chemical vapor deposition (MOCVD), and/or metalorganic vapour phase epitaxy (MOVPE)).

In an embodiment the width and length of well 107 is maintained much lower than the height of the trench. This helps capture defects (e.g., defect 130) along the sidewalls of STI 101, 102 and prevents defects from reaching the top of trench 107.

In an embodiment the sidewalls of the trench are shaped as shown in FIG. 1(a) (i.e., a hyperbola). The curvature allows defect trapping at a height (combined height from heights 111, 112) that is less than the product of 1.5 and width 110. Subsequently, the device layers (e.g., layers 105, 106) are grown over the buffer layer (e.g., layer 104) and device processing (not shown) is performed. Such an embodiment may reduce the need for a tall aspect ratio for the trench, allowing defects to be captured within thin buffer layers, thus reducing the cost associated with the process by reducing materials needed (for higher layers of EPI and the like) and process tool time.

In one embodiment trench 107 has combined heights 111, 112 (extending from the trench top to the trench bottom) less than the product of 1.5 and lower width 110. In one embodiment trench 107 includes a lower portion having sidewalls that narrow as the sidewalls move away from the substrate; the sidewalls stop narrowing at the upper width (located at axis 120); and combined heights 111, 112 are no more than the product of 1.5 and the upper width at axis 120. In one embodiment the upper width at axis 120 is narrower than the lower width 110 by a first differential (deviation 113+deviation 114) and the combination of heights 111, 112 is no more than the product of 1.5 and width 110 minus one half of the differential (e.g., deviation 113 or deviation 114).

In an embodiment, either of deviations 113, 114 is 3 to 195 nm, the combination of heights 111, 112 is 5 nm to several microns, and width 110 is 5 to 200 nm This compares to a conventional ART system where a trench width of 10 nm would require a height of at least 15 nm (height equals the product of 1.5 and the width based on the tangent of 55 degree angle between the trench bottom and a defect). An embodiment includes a height equal to the product of 1.5 and (width 110−deviation 113, which is 10 nm-3 nm). Thus, the height is 10.5 nm (instead of 15 nm as would be the case of a classic ART system using a 10 nm width).

FIG. 1(b) includes an embodiment where trench 107 includes a lower portion (bound by the trench bottom, sidewalls, and the width at axis 120) shaped like a trapezoid. In an embodiment, height 111 is equal to the product of 1.5 and deviation 113 for a height equaling 20-750 nm in various embodiments. The addition of widths 110, 113, 114 equals 15 to 500 nm in various embodiments. Width 113 and width 114 may each be 5 nm or more. Height 112 may be 0 nm to several microns. An embodiment includes height 111 equal to the product of 1.5 and (width 110-deviation 113, which is 10 nm-3 nm). Thus, height 111 is 10.5 nm (instead of 15 nm as would be the case of a classic ART system using a 10 nm width).

Both of FIGS. 1(a) and 1(b) include trench 107 with a lower half that includes a sidewall that joins the bottom of the trench at angle 123. Angle 123 may be less than 70 degrees. In other embodiments, angle 123 is 60, 55, 50, 45, 40 degrees and the like. Also, while 1.5 has been used as a ratio for determining heights (e.g., the combination of heights 111, 112 for FIG. 1(a) and height 111 for FIG. 1(b)) other ratios are provided for in various embodiments as may be dictated by the severity of angle 123 and the curvature of trench sidewalls. In an embodiment the trench has a height extending from the trench top to the trench bottom and the height is less than 1.3 times the width 110. In an embodiment the trench has a height extending from the trench top to the trench bottom and the height is less than 1.4 times the width 110. In an embodiment the trench has a height extending from the trench top to the trench bottom and the height is less than 1.1 times the width 110 (e.g., see example where heath is 10.5 nm and width is 10 nm).

Regarding shaping the sidewalls of trench 107, in the embodiment of FIG. 1(a) trench 107 may be patterned using, for example, a resist layer and a hard mask. Resist is patterned and then a hard mask is etched using the resist as the mask. The choice of etch chemistry and the amount of the etch depth dictates the curved profile of the sidewalls inside the trench.

In FIG. 1(b) a hard mask is etched using patterned resist, which is used to generate a fin that gives the straight profile to the upper part of trench 107. Regarding the lower part of trench 107, a portion of substrate 103 below the hard mask is wet etched selectively in (111) direction to give the tapered profile. STI is filled around the patterned hard mask and the underlying fin. This is followed by removal of the hard mask and fin selectively with respect to the STI, yielding trench 107. EPI layer growth may then follow.

Figure 2A:
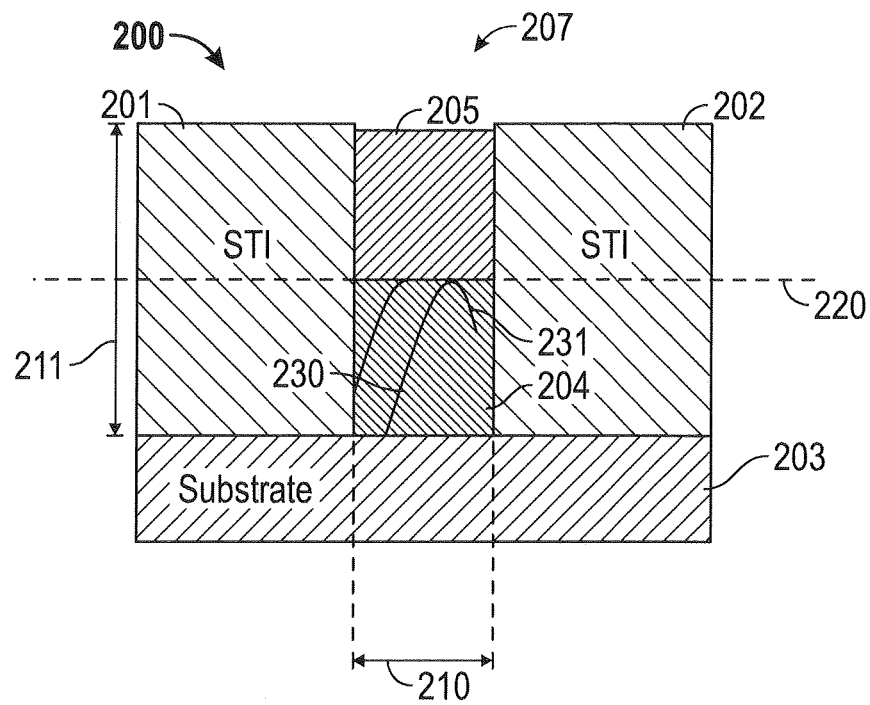
FIGS. 2(a)-(b) depict a trench with an EPI layer and defect barrier in an embodiment.
Figure 2B:
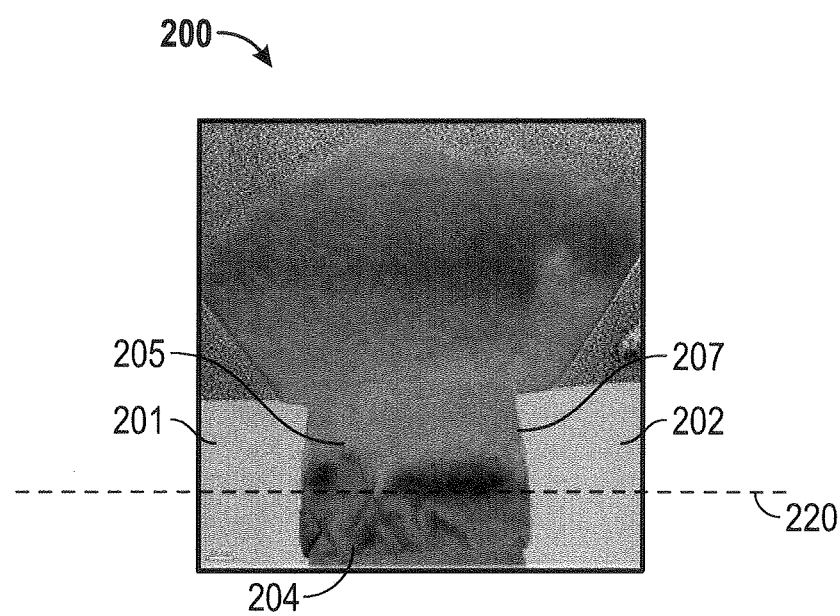
Figure 6:
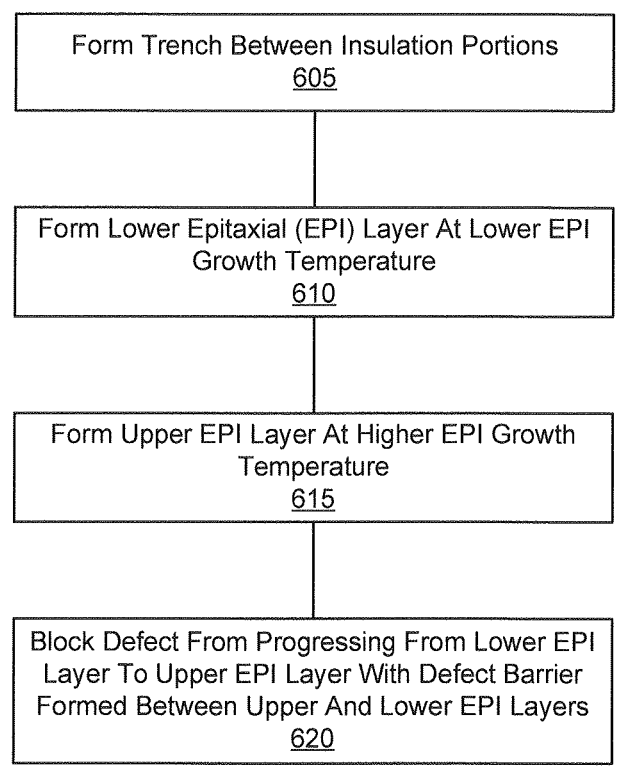
FIG. 6 includes a process in an embodiment.

FIGS. 2(a)-(b) depict device 200 having a trench that includes an EPI layer with a defect barrier in an embodiment of the invention. FIG. 6 includes a process in an embodiment of the invention. FIGS. 2(a) and 6 are first discussed and then FIG. 2(b) is discussed.

In FIG. 2(a) trench 207 is included in STI portions 201, 202 and on substrate 203 (Block 605). Substrate 203 may contain Si, such as a Si and/or SiGe substrate but other embodiments are not so limited. One embodiment includes a SiGe common buffer on a Si substrate, but other embodiments are not so limited. Trench 207 includes a top and a bottom and extends downwards towards substrate 203. Lower EPI layer 204, located in the trench adjacent the trench bottom (Block 610), has a lattice constant mismatched with a lattice constant that corresponds to substrate 203 (or a top layer of substrate 203 if an intermediate layer, such as a buffer layer, is included between the lower portions of substrate 203 and EPI layer 204).

Upper EPI layer 205 is formed over and in direct contact with lower EPI layer 204, the lower and upper EPI layers 204, 205 being monolithic with one another (Block 615). Further, lower and upper EPI layers 204, 205 directly join one another at barrier 220, which blocks defects (e.g., defect 230) in lower EPI layer 204. In an embodiment upper EPI layer 205 has lattice constant generally equal to the lattice constant of EPI layer 204.

The embodiment of FIG. 2(a) terminates defects by changing temperatures during EPI growth in trench 207. Low growth temperature film 204 is grown first. Subsequently, growth is paused and growth temperature is increased. The pause in growth changes the surface condition such that interface 220 is formed, which blocks defects in underlying layer 204 from propagating up into layer 205. Subsequent growth at a higher temperature is followed through to form layer 205. In one embodiment, the lower temperature is 400 C and the higher temperature is 550 C but other embodiments are not so limited and may include lower temperatures of, for example, 300, 325, 350, 375, 400, 425, 450 C and higher temperatures of 450, 475, 500, 525, 575, 600 C.

Thus, in an embodiment lower EPI layer 204 includes more defects than upper EPI layer 205. Defect 230 in lower EPI layer 204 grows upwards and then deflects off barrier 220 and grows downwards (see defect portion 231) towards substrate 203 (Block 620). In an embodiment barrier 220 extends from one of the trench sidewalls to another of the sidewalls.

In one embodiment height 211 equals the product of 1.5 and width 210; however other embodiments are not so limited.

FIG. 2(b) includes an image illustrating trench 207 with defect barrier 220 between layers 204 and 205. Layer 204 has far more defects contained within that layer than layer 205, which shows fewer defects, if any, concentrated near barrier 220 and away from the top of the trench.

Figure 3A:
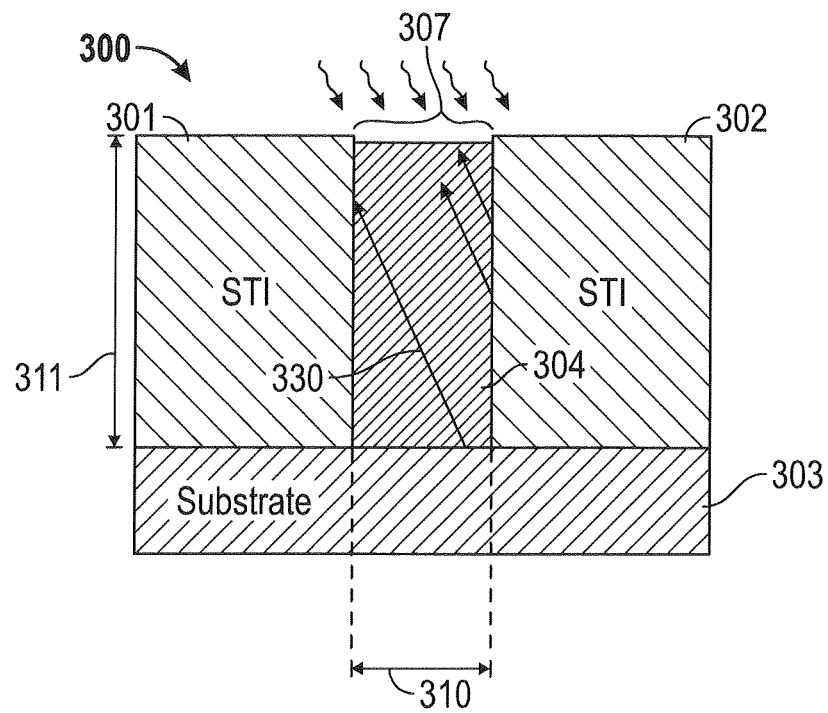
FIGS. 3(a)-(b) depict a trench including an annealed EPI layer in an embodiment.
Figure 3B:
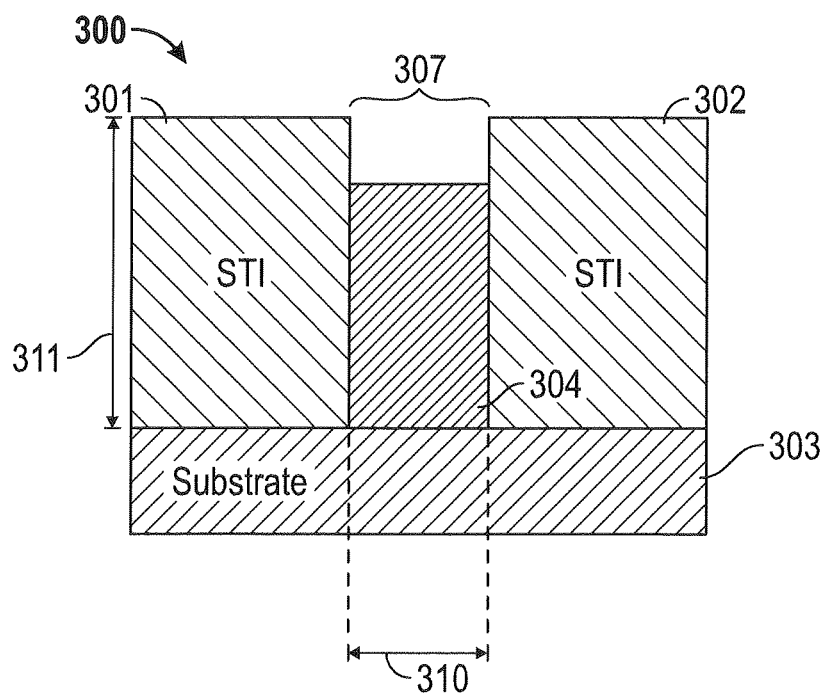
Figure 7:
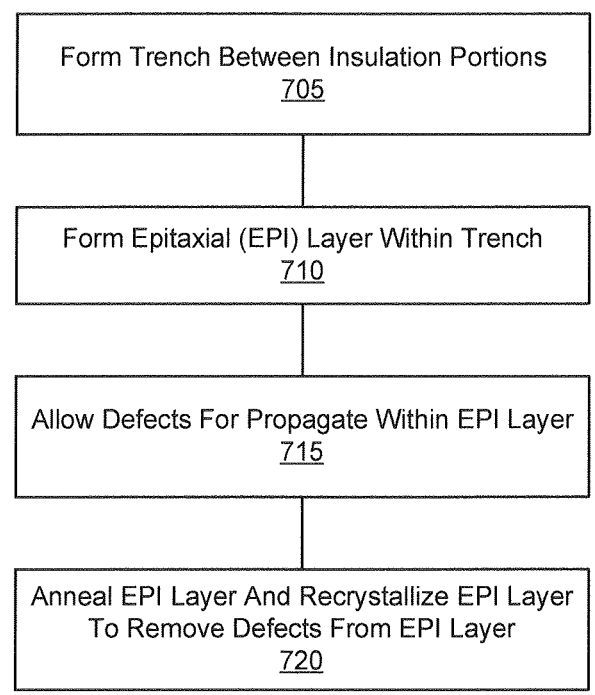
FIG. 7 includes a process in an embodiment.

FIGS. 3(a)-(b) depict device 300 having a trench with an annealed EPI layer in an embodiment of the invention. FIG. 7 includes a process in an embodiment of the invention.

In FIG. 3(a) trench 307 is located between STI portions 301, 302 and above substrate 303 (Block 705). EPI layer 304 is formed within trench 307 (Block 710). Due to a lattice mismatch between EPI layer 304 and substrate 303 defects (e.g., defect 330) propagate within layer 304 (Block 715). However, an anneal of layer 304 yields the embodiment of FIG. 3(b) (Block 720). In one embodiment height 311 equals the product of 1.5 and width 310; however other embodiments are not so limited.

FIG. 3(b) includes an embodiment with trench 307, having a top and a bottom, between insulation layers 301, 302 and on substrate 303. EPI layer 304 is in the trench adjacent the trench bottom and has no defects. The lack of defects may be due to annealing (Block 720). In an embodiment EPI layer 304 comprises one of a IV and a III-V material and substrate 303 includes silicon (e.g., Si or SiGe). In an embodiment EPI layer 304 and substrate 303 include equal lattice constants (e.g., due to the annealing) and EPI layer 304 directly contacts substrate 303.

In another embodiment (not shown) EPI layer 304 couples to substrate 303 via an intermediate layer having a lattice constant that equals the EPI layer lattice constant (due to annealing) and the EPI layer directly contacts the intermediate layer.

Thus, in one embodiment after the growth of an EPI layer in the trench, the device is annealed at a high temperature (e.g., rapid thermal, spike, flash, and/or laser annealing). The high thermal budget melts the EPI film. Once melted, the wafer is cooled down to room temperature. The cooling cycle induces recrystallization of the melted film which then conforms to the lattice constant of the underlying layer (e.g., substrate or intermediate layer between lower portion of substrate and EPI layer). However, another embodiment does not melt the EPI layer. Instead, the embodiment anneals at temperatures below the melting point for layer 304 while still causing recrystallization. In an embodiment recrystallization occurs at a temperature above the product of 0.6 and the melting point of EPI layer 304; however other embodiments are not so limited and may include, for example, multiplicands of 0.5, 0.7, 0.8 and the like.

Figure 4A:
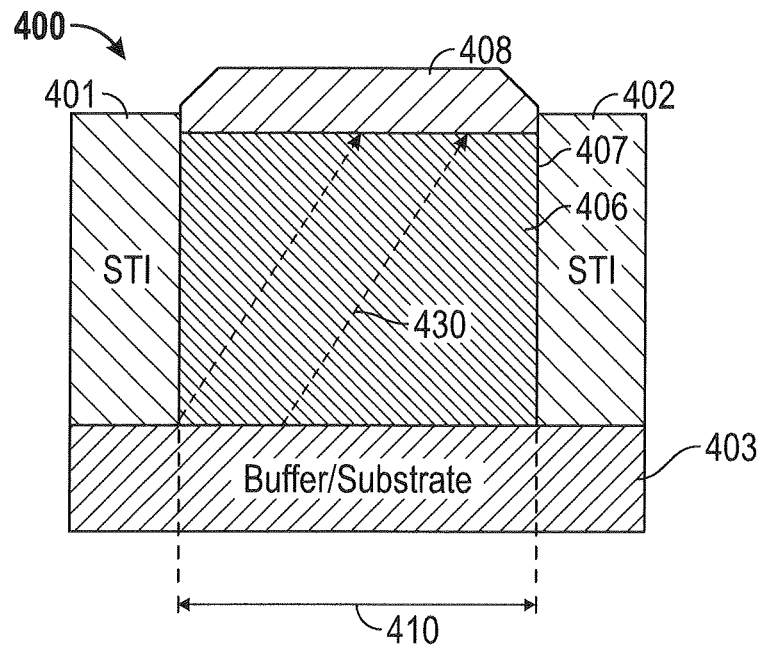
FIGS. 4(a)-(b) depict a trench with a superlattice and EPI layer in an embodiment.
Figure 4B:
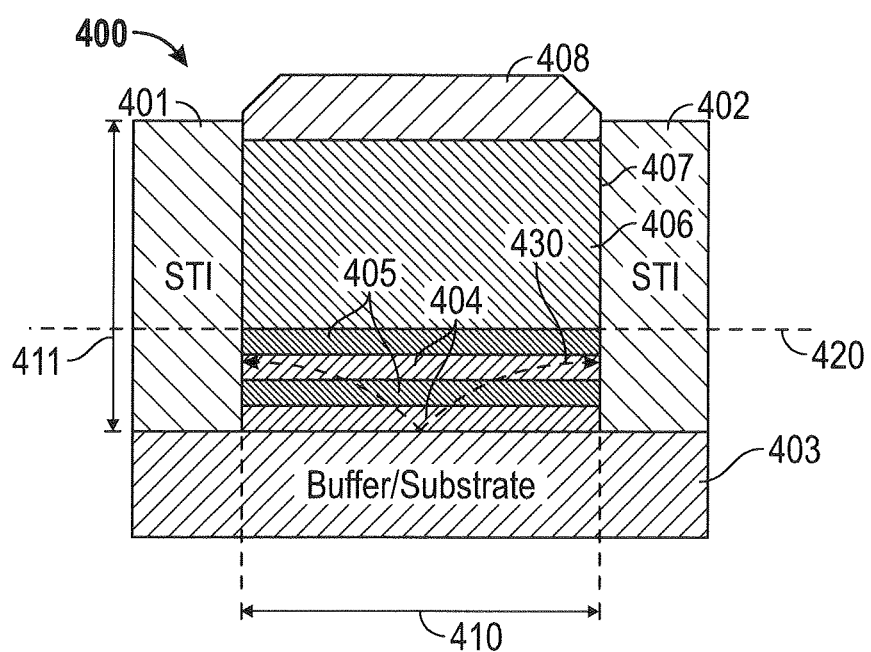
Figure 8:
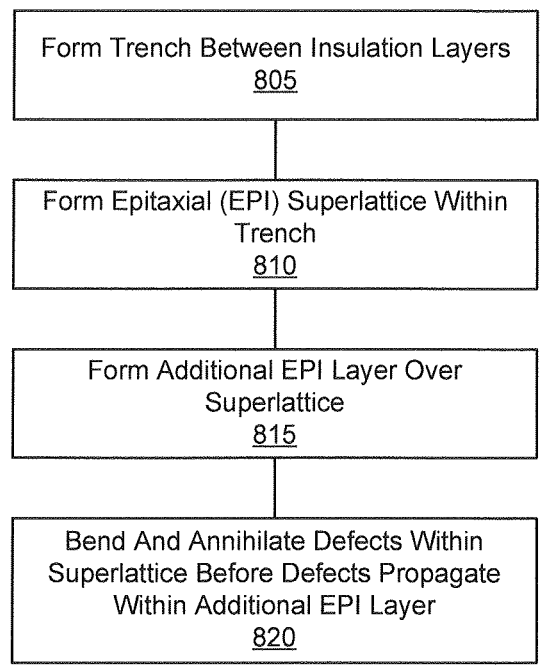
FIG. 8 includes a process in an embodiment.

FIGS. 4(a)-(b) depict device 400 with a trench including a superlattice and an EPI layer in an embodiment of the invention. FIG. 8 includes a process in an embodiment of the invention.

In FIG. 4(a) trench 407 is located between STI portions 401, 402 and above substrate 403. Due to a lattice mismatch between EPI layer 406 and substrate 403 defects (e.g., defect 430) propagate within layer 406.

However, FIG. 4(b) includes an embodiment with trench 407 included between insulation layers 401, 402 (Block 805) and formed on substrate 403. Substrate 403 may contain Si, such as a Si and/or SiGe substrate but other embodiments are not so limited. One embodiment includes a SiGe common buffer on a Si substrate, but other embodiments are not so limited. Further, trench 407 includes a superlattice adjacent the trench bottom (Block 810) and axis 420. A superlattice is a periodic structure of layers of two (or more) materials (which may change merely in concentration among elements or may include entirely different elements). The superlattice including EPI layer or layers 404 and EPI layer or layers 405 formed over and in direct contact with any of EPI layers 404. EPI layer 406 is in trench 407 above the superlattice (Block 815). The superlattice may include 2, 3, 4, 5, 6, 7 or more layers. In various embodiments the superlattice includes alternating layers of, for example, Si and SiGe, InGaAs and InP, and combinations of Si, SiGe, InGaAs, and InP.

In one embodiment the superlattice includes a Ge seed layer contacting an intermediate layer that is directly contacting a Si substrate. The Ge seed layer is followed upwards by $Si_{50}Ge_{50}$, Ge, $Si_{50}Ge_{50}$, Ge, and then more superlattice layers or a layer like layer 406. The intermediate layer may include $Si_{70}Ge_{30}$ near the substrate and $Si_{30}Ge_{70}$ near the Ge seed layer. Another embodiment is the same as above but with no Ge seed layer.

Any of EPI layers 404, 405, 406, or even EPI layer 408, may include the same lattice constant as one another or a different lattice constant from one or more fellow EPI layers. Also, any of EPI layers 404, 405, 406 may have a lattice mismatch with substrate 403 or some intermediate layer between a lower portion of substrate 403 and the EPI layer in question.

In the embodiment of FIG. 4(b) multilayer growth is used to block or glide defects (e.g., defect 430) from propagating to top layers, such as layer 406. Strain introduced by the superlattice (e.g., layers 404, 405) causes dislocations to bend and annihilate inside the superlattice (Block 820). An embodiment may also include implementation of multilayers in buffer/substrate layer(s). Thus, in an embodiment the superlattice includes more defects than the EPI layer 406.

In one embodiment height 411 equals the product of 1.5 and width 410; however other embodiments are not so limited. In one embodiment, width 410 is between 5 and 200 nm. In one embodiment the superlattice has a height between 2 and 50 nm. In an embodiment an intermediate layer between the lower substrate and the superlattice is 1.3 microns in height.

Any of the EPI layers discussed herein may be included in, for example, a channel of a transistor.

In an embodiment an apparatus comprises: a trench, having a top and a bottom, in an insulation layer that is on a substrate having a first lattice constant; wherein (a) the trench extends downwards towards the substrate; (b) the trench has a lower width adjacent the trench bottom and an upper width above the lower width, and (c) the upper width is narrower than the lower width; and a lower epitaxial (EPI) layer, having a second lattice constant mismatched with the first lattice constant, in the trench adjacent the trench bottom and below the trench upper width. An embodiment comprises an upper EPI layer in the trench above the lower EPI layer. In an embodiment the lower EPI layer includes more defects than the upper EPI layer. In an embodiment the upper EPI layer is included in a device layer and has a third lattice constant; and a differential between the first and third lattice constants is greater than a differential between the first and second lattice constants. In an embodiment the trench has a height extending from the trench top to the trench bottom and the height is less than 1.5 times the lower width. In an embodiment the trench has a height extending from the trench top to the trench bottom and the height is less than 1.4 times the lower width. In an embodiment the trench has a height extending from the trench top to the trench bottom and the height is less than 1.3 times the lower width. In an embodiment the trench includes a lower portion having sidewalls that narrow as the sidewalls move away from the substrate; the sidewalls stop narrowing at the upper width; the trench has a height extending from the trench bottom to the upper width; and the upper width is narrower than the lower width by a first differential and the height is no more than a product of 1.3 and one half of the differential. In an embodiment the trench has a height extending from the trench top to the trench bottom: the trench includes a lower portion having sidewalls that narrow as the sidewalls move away from the substrate and the sidewalls stop narrowing at the upper width; and the upper width is narrower than the lower width by a first differential and the height is no more than a product of 1.3 and one half of the differential. In an embodiment the trench has a cross-section shaped like a hyperbola. In an embodiment the trench includes a lower portion, extending from the lower width to the upper width, shaped like a trapezoid. In an embodiment the trench includes a lower half and an upper half and the lower half includes a side wall that joins the bottom of the trench at an angle of less than 70 degrees between the side wall and the bottom of the trench.

An embodiment comprises: a trench included in an insulation layer that is formed on a substrate having a first lattice constant, the trench having a top and a bottom and extending downwards towards the substrate; a lower epitaxial (EPI) layer, having a second lattice constant mismatched with the first lattice constant, in the trench adjacent the trench bottom; an upper EPI layer formed over and in direct contact with the lower EPI layer, the lower and upper EPI layers being monolithic with one another; wherein the lower and upper EPI layers directly join one another at a barrier that blocks defects in the lower EPI layer. In an embodiment the lower EPI layer includes more defects than the upper EPI layer. An embodiment includes a defect in the lower EPI layer grows upwards and then deflects off the barrier and grows downwards towards the substrate. In an embodiment the upper EPI layer has a third lattice constant generally equal to the second lattice constant. In an embodiment the trench includes opposing sidewalls and the barrier extends from one of the sidewalls to another of the sidewalls. In an embodiment the lower EPI layer is formed at a lower EPI layer growth temperature and the upper EPI layer is formed at an upper EPI layer growth temperature that is higher than the lower EPI growth temperature.

An embodiment comprises: a trench included in an insulation layer that is formed on a substrate having a substrate lattice constant, the trench having a top and a bottom and extending downwards towards the substrate; a superlattice in the trench adjacent the trench bottom, the superlattice including (a) a first epitaxial (EPI) layer having a first lattice constant mismatched with the substrate lattice constant, and (b) a second EPI layer formed over and in direct contact with the first EPI layer; a third EPI layer in the trench above the superlattice. In an embodiment the superlattice includes more defects than the third EPI layer. In an embodiment defects annihilate in the superlattice. In an embodiment the second EPI layer includes a second lattice constant, the third EPI layer includes a third lattice constant, and a differential between the substrate and third lattice constants is greater than a differential between the substrate and first lattice constants.

An embodiment comprises: a trench, having a top and a bottom, in an insulation layer that is on a substrate having a first lattice constant; and an epitaxial (EPI) layer, having a second lattice constant, in the trench adjacent the trench bottom; wherein the EPI layer includes no defects. In an embodiment the EPI layer comprises one of a IV and a III-V material and the substrate includes silicon. In an embodiment the first lattice constant equals the second lattice constant and the EPI layer directly contacts the substrate. In an embodiment the EPI layer couples to the substrate via an intermediate layer having a third lattice constant, the second lattice constant equals the third lattice constant, and the EPI layer directly contacts the intermediate layer.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a trench, having a top and a bottom, in an insulation layer that is on a substrate having a first lattice constant; wherein (a) the trench extends downwards towards the substrate; (b) the trench has a lower width adjacent the trench bottom and an upper width above the lower width, and (c) the upper width is narrower than the lower width; and
   a lower epitaxial (EPI) layer, having a second lattice constant mismatched with the first lattice constant, in the trench adjacent the trench bottom and below the trench upper width.

2. The apparatus of claim 1 comprising an upper EPI layer in the trench above the lower EPI layer.

3. The apparatus of claim 2 wherein the lower EPI layer includes more defects than the upper EPI layer.

4. The apparatus of claim 3, wherein the upper EPI layer is included in a device layer and has a third lattice constant; and a differential between the first and third lattice constants is greater than a differential between the first and second lattice constants.

5. The apparatus of claim 3, wherein the trench has a height extending from the trench top to the trench bottom and the height is less than 1.3 times the lower width.

6. The apparatus of claim 3, wherein:
   the trench includes a lower portion having sidewalls that narrow as the sidewalls move away from the substrate;
   the sidewalls stop narrowing at the upper width;
   the trench has a height extending from the trench bottom to the upper width; and
   the upper width is narrower than the lower width by a first differential and the height is no more than a product of 1.3 and one half of the differential.

7. The apparatus of claim 3, wherein:
   the trench has a height extending from the trench top to the trench bottom:
   the trench includes a lower portion having sidewalls that narrow as the sidewalls move away from the substrate and the sidewalls stop narrowing at the upper width; and
   the upper width is narrower than the lower width by a first differential and the height is no more than a product of 1.3 and one half of the differential.

8. The apparatus of claim 3, wherein the trench has a cross-section shaped like a hyperbola.

9. The apparatus of claim 3, wherein the trench includes a lower portion, extending from the lower width to the upper width, shaped like a trapezoid.

10. The apparatus of claim 1, wherein the trench includes a lower half and an upper half and the lower half includes a side wall that joins the bottom of the trench at an angle of less than 70 degrees between the side wall and the bottom of the trench.

11. The apparatus of claim 2, wherein the upper EPI layer is included in a device layer and has a third lattice constant; and a differential between the first and third lattice constants is greater than a differential between the first and second lattice constants.

12. The apparatus of claim 1, wherein the trench has a height extending from the trench top to the trench bottom and the height is less than 1.3 times the lower width.

13. The apparatus of claim 1, wherein:
   the trench includes a lower portion having sidewalls that narrow as the sidewalls move away from the substrate;
   the sidewalls stop narrowing at the upper width;
   the trench has a height extending from the trench bottom to the upper width; and
   the upper width is narrower than the lower width by a first differential and the height is no more than a product of 1.3 and one half of the differential.

14. The apparatus of claim 1, wherein:
   the trench has a height extending from the trench top to the trench bottom;
   the trench includes a lower portion having sidewalls that narrow as the sidewalls move away from the substrate and the sidewalls stop narrowing at the upper width; and
   the upper width is narrower than the lower width by a first differential and the height is no more than a product of 1.3 and one half of the differential.

15. The apparatus of claim 1, wherein the trench has at least one of (a) a cross-section shaped like a hyperbola, and (b) a lower portion, extending from the lower width to the upper width, shaped like a trapezoid.

16. An apparatus comprising:
   a trench, having a top and a bottom, in an insulation layer that is on a substrate having a first lattice constant; wherein (a) the trench extends downwards towards the substrate; (b) the trench has a lower width adjacent the trench bottom and an upper width above the lower width, and (c) the upper width is narrower than the lower width; and
   a lower epitaxial (EPI) layer, having a second lattice constant mismatched with the first lattice constant, in the trench adjacent the trench bottom and below the trench upper width;
   wherein the trench includes a lower half and an upper half and the lower half includes a side wall that joins the bottom of the trench at an angle of less than 70 degrees between the side wall and the bottom of the trench.

17. The apparatus of claim 16 comprising an upper EPI layer in the trench above the lower EPI layer.

18. The apparatus of claim 17 wherein the lower EPI layer includes more defects than the upper EPI layer.

19. The apparatus of claim 17, wherein the upper EPI layer is included in a device layer and has a third lattice constant; and a differential between the first and third lattice constants is greater than a differential between the first and second lattice constants.

20. The apparatus of claim 16, wherein the trench has a height extending from the trench top to the trench bottom and the height is less than 1.3 times the lower width.

21. The apparatus of claim 16, wherein:
   the trench includes a lower portion having sidewalls, including the sidewall and an additional sidewall, that narrow as the sidewalls move away from the substrate;
   the sidewalls stop narrowing at the upper width;
   the trench has a height extending from the trench bottom to the upper width; and
   the upper width is narrower than the lower width by a first differential and the height is no more than a product of 1.3 and one half of the differential.

22. The apparatus of claim 16, wherein:
   the trench has a height extending from the trench top to the trench bottom;
   the trench includes a lower portion having sidewalls, including the sidewall and an additional sidewall, that narrow as the sidewalls move away from the substrate and the sidewalls stop narrowing at the upper width; and
   the upper width is narrower than the lower width by a first differential and the height is no more than a product of 1.3 and one half of the differential.

23. The apparatus of claim 16, wherein the trench has a cross-section shaped like a hyperbola.

24. The apparatus of claim 16, wherein the trench includes a lower portion, extending from the lower width to the upper width, shaped like a trapezoid.

* * * * *